United States Patent
Kitt

(10) Patent No.: US 10,454,433 B2
(45) Date of Patent: Oct. 22, 2019

(54) AMPLIFIER ASSEMBLY AND SPATIAL POWER COMBINING DEVICE

(71) Applicant: Qorvo US, Inc., Greensboro, NC (US)

(72) Inventor: John Kitt, Ventura, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/637,472

(22) Filed: Jun. 29, 2017

(65) Prior Publication Data

US 2019/0007007 A1 Jan. 3, 2019

(51) Int. Cl.
| | |
|---|---|
| *H01P 5/12* | (2006.01) |
| *H03F 3/24* | (2006.01) |
| *H03F 3/60* | (2006.01) |
| *H01Q 13/18* | (2006.01) |
| *H01Q 21/00* | (2006.01) |
| *H01Q 23/00* | (2006.01) |
| *H03F 3/195* | (2006.01) |

(52) U.S. Cl.
CPC .............. *H03F 3/195* (2013.01); *H01P 5/12* (2013.01); *H01Q 13/18* (2013.01); *H01Q 21/0025* (2013.01); *H03F 3/24* (2013.01); *H03F 3/602* (2013.01); *H01Q 23/00* (2013.01)

(58) Field of Classification Search
CPC ............ H03F 3/195; H03F 3/24; H03F 3/602; H01Q 13/18; H01Q 21/0025; H01Q 23/00
USPC ......................................................... 333/125
See application file for complete search history.

(56) References Cited

U.S. PATENT DOCUMENTS

| | | | |
|---|---|---|---|
| 4,234,854 A | 11/1980 | Schellenberg et al. | |
| 4,424,496 A | 1/1984 | Nichols et al. | |
| 5,036,335 A * | 7/1991 | Jairam | H01Q 13/085 343/767 |
| 5,214,394 A | 5/1993 | Wong | |
| 5,736,908 A | 4/1998 | Alexanian et al. | |
| 5,920,240 A | 7/1999 | Alexanian et al. | |
| 6,028,483 A * | 2/2000 | Shealy | H03F 3/195 330/286 |
| 6,037,840 A | 3/2000 | Myer | |
| 6,181,221 B1 | 1/2001 | Kich et al. | |
| 6,828,875 B2 | 12/2004 | Channabasappa et al. | |
| 7,110,165 B2 | 9/2006 | Martin et al. | |
| 7,215,220 B1 | 5/2007 | Jia | |
| 7,466,203 B2 | 12/2008 | Rector | |

(Continued)

OTHER PUBLICATIONS

Notice of Allowance for U.S. Appl. No. 15/290,749, dated Feb. 16, 2018, 9 pages.

(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

An amplifier assembly for a spatial power combining device. The amplifier assembly includes a body that forms a first antenna, wherein the first antenna is a first Vivaldi antenna including a first circular backstub and a first tapered slot portion. The amplifier assembly further includes a second antenna, and a printed circuit board (PCB) assembly fixed to the body. The PCB assembly includes a PCB, an amplifier mounted on the PCB, a first transmission line coupled to the first antenna and to the amplifier, and a second transmission line coupled to the second antenna and to the amplifier.

19 Claims, 7 Drawing Sheets

(56) References Cited

U.S. PATENT DOCUMENTS

| | | | |
|---|---|---|---|
| 8,698,577 | B2 | 4/2014 | Sherrer et al. |
| 8,928,429 | B2 | 1/2015 | Song et al. |
| 9,019,036 | B2 | 4/2015 | Kolias et al. |
| 9,054,427 | B2 * | 6/2015 | Guy ..................... F16B 5/0614 |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,917,343 | B2 | 3/2018 | Chieh et al. |
| 9,954,706 | B1 | 4/2018 | Harris et al. |
| 10,009,067 | B2 | 6/2018 | Birk et al. |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Notice of Allowance for U.S. Appl. No. 15/927,565, dated Aug. 8, 2018, 8 pages.

Non-Final Office Action for U.S. Appl. No. 15/846,840, dated Mar. 21, 2019, 4 pages.

Non-Final Office Action for U.S. Appl. No. 15/933,783, dated May 1, 2019, 8 pages.

Non-Final Office Action for U.S. Appl. No. 16/042,351, dated Jul. 5, 2019, 5 pages.

Notice of Allowance for U.S. Appl. No. 15/846,840, dated Jul. 5, 2019, 7 pages.

Non-Final Office Action for U.S Appl. No. 15/981,535, dated Jul. 8, 2019, 5 pages.

Non-Final Office Action for U.S. Appl. No. 15/933,821, dated Jul. 11, 2019, 7 pages.

Non-Final Office Action for U.S. Appl. No. 15/981,516, dated Jul. 17, 2019, 5 pages.

* cited by examiner

AMPLIFIER ASSEMBLY AND SPATIAL POWER COMBINING DEVICE

FIELD OF THE DISCLOSURE

The disclosure relates generally to an amplifier assembly and, more particularly, to an amplifier assembly for a spatial power combining device.

BACKGROUND

Spatial power combining devices (SPCDs), such as a Qorvo® Spatium® spatial power combining device, utilize a plurality of amplifier assemblies that form a coaxial waveguide to amplify an electromagnetic signal. Each individual amplifier assembly includes an input antipodal finline antenna, an amplifier, and an output antipodal finline antenna. When the amplifier assemblies are combined to form the coaxial waveguide, the input antipodal finline antennas form an input antipodal finline antenna array, and the output antipodal finline antennas form an output finline antenna array.

In operation, an electromagnetic signal is passed through an input port and an input coaxial waveguide section of the spatial power combining device. The input coaxial waveguide section distributes the electromagnetic signal to the input antipodal finline antenna array. Each amplifier amplifies the received signal portion of the electromagnetic signal, and outputs an amplified signal portion via an output antipodal finline antenna. The output antipodal finline antenna array combines the amplified signal portions to form an amplified electromagnetic signal that is passed to an output coaxial waveguide section and then to an output port of the spatial power combining device.

Conventional spatial power combining devices typically use finline antennas. The use of finline antennas has certain drawbacks, including that the printed circuit board (PCB) in which the finline antenna is formed becomes increasingly lossy at higher frequencies. Moreover, a finline antenna requires radio frequency (RF) grounding along its main axis, and thus, the PCB must be solder-attached to the metal body of the amplifier assembly and to the adjacent amplifier assembly. It may be difficult, during assembly of a spatial power combining device, to ensure that the top layer metal of each finline antenna is properly attached to an adjacent amplifier assembly. Failure to properly attach the finline antennas to adjacent amplifier assemblies can result in output power dropouts and amplifier instability.

SUMMARY

The disclosure relates generally to an amplifier assembly and, more particularly, to an amplifier assembly for a spatial power combining device (SPCD). The amplifier assembly includes at least one Vivaldi antenna. The Vivaldi antenna includes a first circular backstub and a first tapered slot portion. Among other advantages, the use of a Vivaldi antenna simplifies manufacture of the amplifier assembly, eliminates a need to attach each amplifier assembly to an adjacent amplifier assembly, and reduces loss particularly in high frequency SPCDs, such as 15 GHz or greater.

In one embodiment an amplifier assembly for an SPCD is provided. The amplifier assembly includes a body that forms a first antenna, wherein the first antenna is a first Vivaldi antenna including a first circular backstub and a first tapered slot portion. The amplifier assembly further includes a second antenna, and a printed circuit board (PCB) assembly fixed to the body. The PCB assembly includes a PCB, an amplifier mounted on the PCB, a first transmission line coupled to the first antenna and to the amplifier, and a second transmission line coupled to the second antenna and to the amplifier.

In another embodiment an SPCD is provided. The SPCD includes a center waveguide section including a plurality of amplifier assemblies. Each amplifier assembly includes a body that forms a first antenna, wherein the first antenna is a first Vivaldi antenna comprising a first circular backstub and a first tapered slot portion. Each amplifier assembly also includes a second antenna, and a printed circuit board (PCB) assembly fixed to the body. The PCB assembly includes a PCB, an amplifier mounted on the PCB, a first transmission line coupled to the first antenna and to the amplifier, and a second transmission line coupled to the second antenna and to the amplifier. The SPCD also includes an input port configured to receive a signal, an input coaxial waveguide section coupled to the input port and configured to distribute the signal to the plurality of amplifier assemblies, an output coaxial waveguide section configured to receive a plurality of output signals from the plurality of amplifier assemblies, and an output port coupled to the output coaxial waveguide section.

In another embodiment a method for amplifying a signal is provided. The method includes receiving, by a first Vivaldi antenna formed in a body of an amplifier assembly of an SPCD that includes a plurality of amplifier assemblies, a signal portion of an input signal, the first Vivaldi antenna including a first circular backstub and a first tapered slot portion. The method further includes communicating, via a first transmission line, the signal portion to an amplifier, amplifying, by the amplifier, the signal portion to generate an amplified signal portion, and communicating, via a second transmission line, the amplified signal portion to a second output antenna.

Those skilled in the art will appreciate the scope of the disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
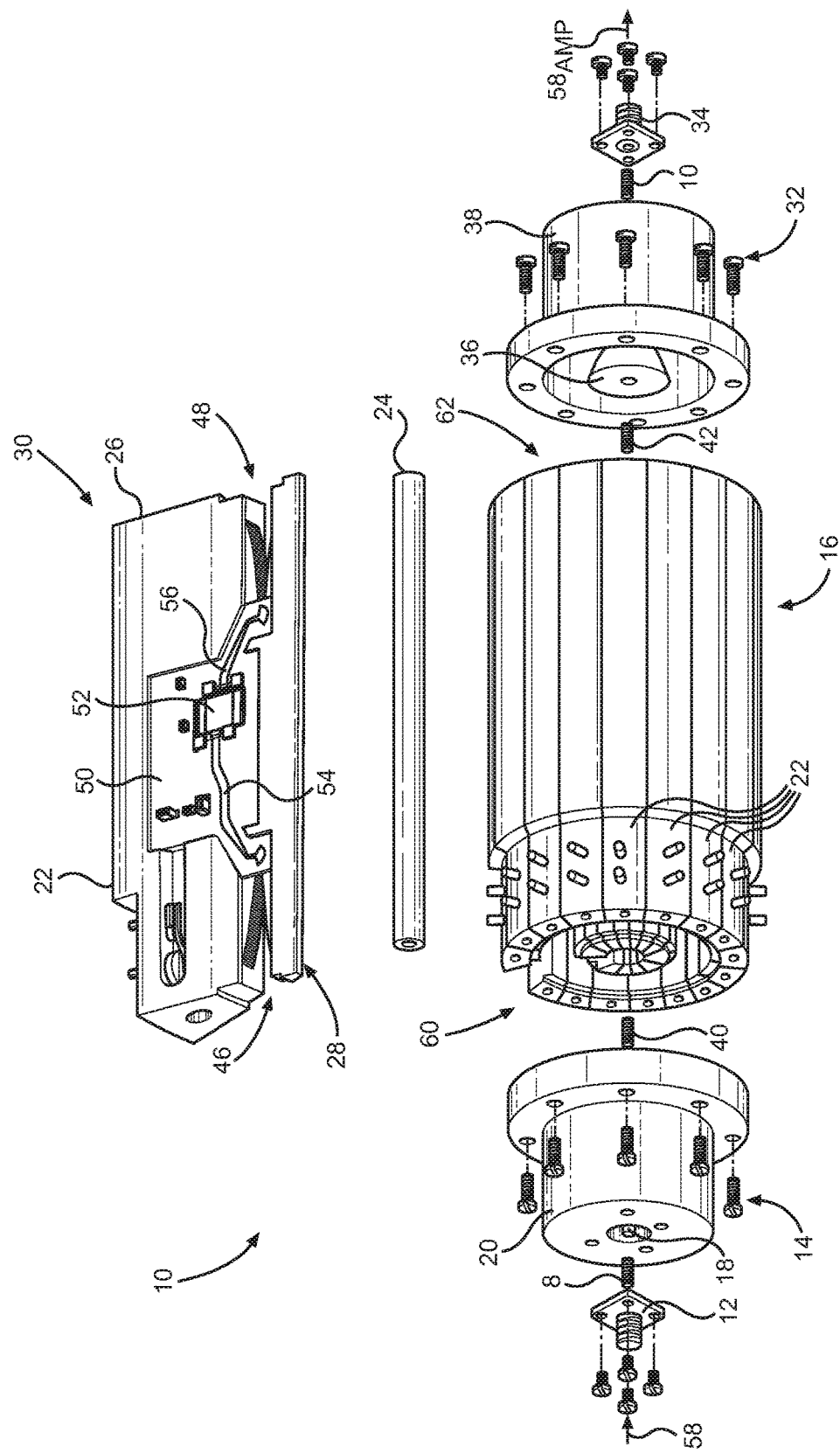
FIG. 1 is a perspective view of a spatial power combining device (SPCD) according to one embodiment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first antenna" and "second antenna," and does not imply a priority, a type, an importance, or other attribute, unless otherwise stated herein. The term "about" used herein in conjunction with a numeric value means any value that is within a range of ten percent greater than or ten percent less than the numeric value. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure relates generally to an amplifier assembly and, more particularly, to an amplifier assembly for a spatial power combining device (SPCD). The amplifier assembly includes at least one Vivaldi antenna. The Vivaldi antenna includes a first circular backstub and a first tapered slot portion. Among other advantages, the use of a Vivaldi antenna simplifies manufacture of the amplifier assembly, eliminates a need to attach each amplifier assembly to an adjacent amplifier assembly, and reduces loss particularly in high frequency applications, such as 15 GHz or greater.

FIG. 1 is a perspective view of an SPCD 10 according to one embodiment. The SPCD 10 includes an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. Outer surfaces of an inner conductor 18 and an inner surface of an outer conductor 20 have gradually changed profiles configured to minimize the impedance mismatch from the input port 12 to the center waveguide section 16.

The center waveguide section 16 comprises a plurality of amplifier assemblies 22 and a cylinder post 24 that has a major longitudinal axis that is coincident with a central longitudinal axis of the center waveguide section 16. The plurality of amplifier assemblies 22 may be positioned circumferentially around the post 24. Each amplifier assembly 22 includes a body 26 having a predetermined wedge-shaped cross-section, an inner surface 28 and an arcuate outer surface 30. When the amplifier assemblies 22 are assembled together, they form a cylinder with a cylindrical central cavity, defined by the inner surfaces 28, which accommodates the post 24.

The SPCD 10 also includes an output coaxial waveguide section 32 and an output port 34. The input port 12 and the output port 34 may be field replaceable Subminiature A (SMA) connectors. In other embodiments, the input port 12 and the output port 34 may be super SMA connectors, type N connectors, K connectors, or any other suitable connectors. The output coaxial waveguide section 32 provides a broadband transition from the center waveguide section 16 to the output port 34. Electrically, the output coaxial waveguide section 32 provides broadband impedance matching from the impedance Zc of the center waveguide section 16 to an impedance $Z_{p2}$ of the output port 34. The outer surfaces of an inner conductor 36 and the inner surface of an outer conductor 38 have gradually changed profiles configured to minimize the impedance mismatch from the output port 34 to the center waveguide section 16.

The post 24 connects with the inner conductors 18, 36 by way of screws 40, 42 on opposite ends of the post 24. The post 24 is provided for simplifying mechanical connections, may have other than a cylindrical shape, and may be omitted altogether.

The amplifier assembly 22 includes a first antenna 46 and a second antenna 48. In this embodiment the first antenna 46 is an input Vivaldi antenna and the second antenna 48 is an output Vivaldi antenna. The amplifier assembly 22 also includes a printed circuit board (PCB) assembly 50, on which an amplifier 52 is mounted. A first transmission line 54 is coupled to the first antenna 46 and to the amplifier 52. A second transmission line 56 is coupled to the second antenna 48 and to the amplifier 52.

In operation, a signal 58 is presented to the input port 12. The first antennas 46 of the amplifier assemblies 22 collectively form an input antenna array 60. The input antenna array 60 couples the incoming signal 58 from the input coaxial waveguide section 14, distributing the signal 58 substantially evenly to each amplifier assembly 22. Each first antenna 46 receives a signal portion of the signal 58 and communicates the signal portion via the first transmission line 54 to the amplifier 52. The amplifier 52 amplifies the portion of the signal 58 to generate an amplified signal portion. Each amplifier 52 transmits the amplified signal portion via the second transmission line 56 and the second antenna 48. The plurality of second antennas 48 form an output antenna array 62 that operates to combine the amplified signal portions inside the opening of the output coaxial waveguide section 32 to form an amplified signal $58_{AMP}$, which is then propagated through the output coaxial waveguide section 32 to the output port 34.

Figure 2A:
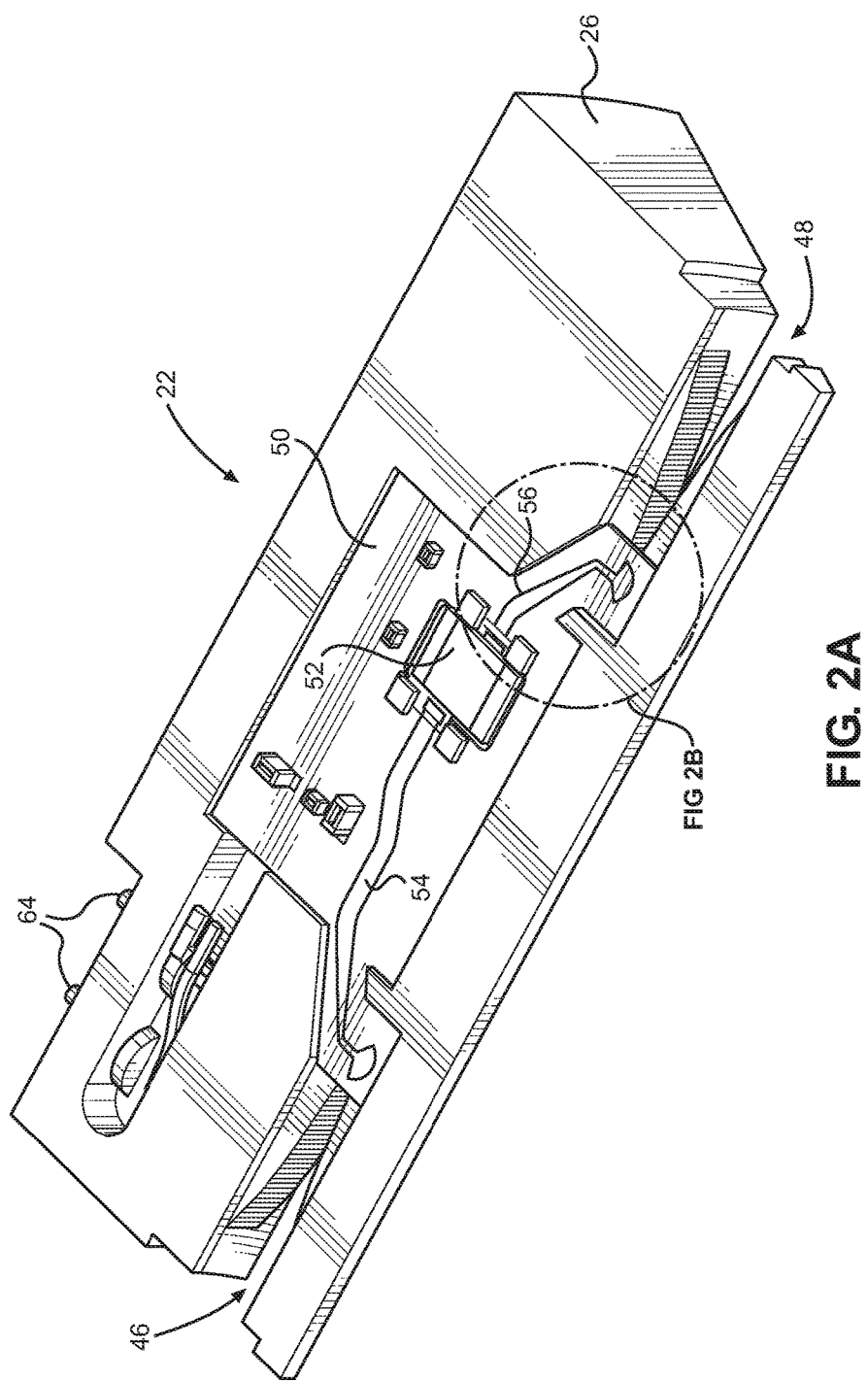
FIG. 2A is a perspective view of an amplifier assembly according to one embodiment.

FIG. 2A is an enlarged perspective view of the amplifier assembly 22 according to one embodiment. The amplifier assembly 22 includes a plurality of direct current power pins 64 that may be coupled to a DC power source to power the amplifier 52. In some embodiments, the amplifier 52 comprises a monolithic microwave integrated circuit (MMIC) amplifier.

Figure 2B:
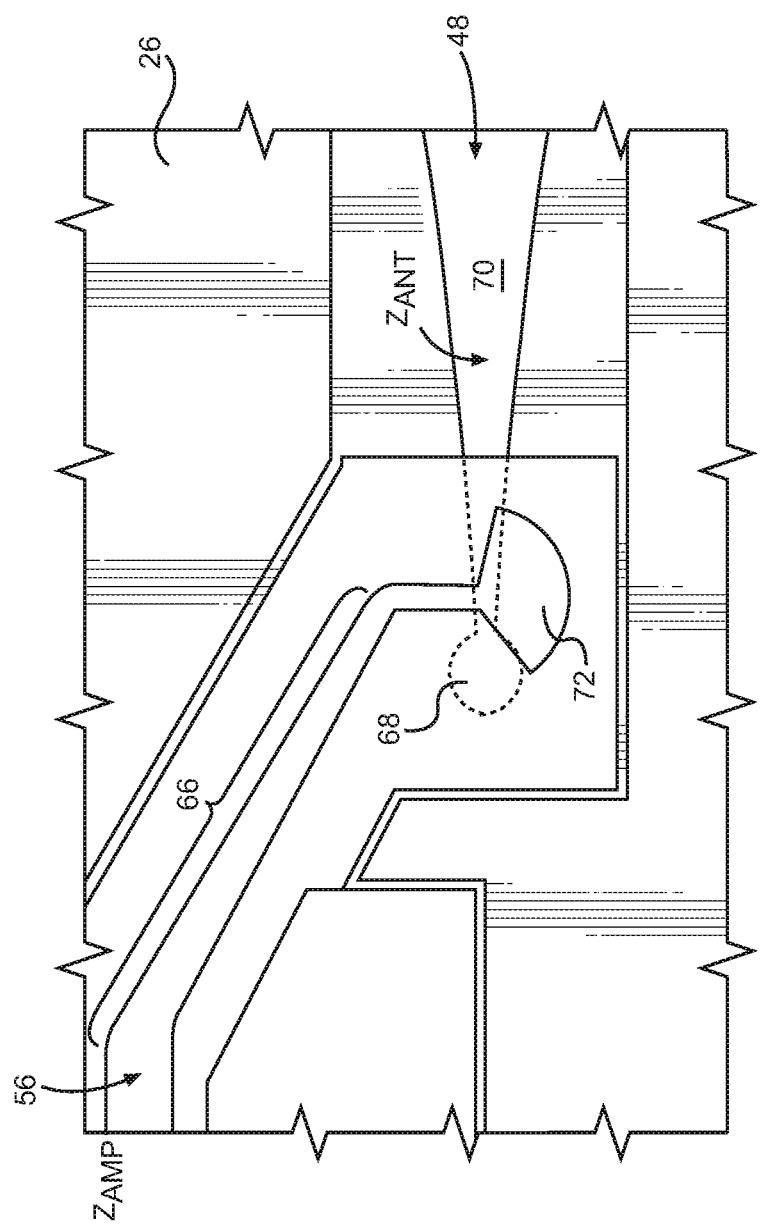
FIG. 2B illustrates a portion of the amplifier assembly illustrated in FIG. 2A in greater detail according to one embodiment.

FIG. 2B illustrates a portion of the amplifier assembly 22. The body 26 forms the second antenna 48, which includes a circular backstub 68 and a tapered slot portion 70. In this embodiment the second transmission line 56 includes an impedance transformer 66 that is configured to minimize an impedance mismatch between an impedance $Z_{ANT}$ of the second antenna 48 and an impedance $Z_{AMP}$ of the amplifier 52 (FIG. 2A). In this embodiment the impedance transformer 66 comprises a tapered portion of the second transmission line 56. The length and extent of the taper may differ depending on the values of the particular impedances $Z_{ANT}$ and $Z_{AMP}$. In one embodiment the impedance $Z_{ANT}$ is about 78 Ohms, and the impedance $Z_{AMP}$ is about 50 Ohms. The second transmission line 56 terminates in a radial stub 72 that is placed in proximity to the circular backstub 68.

Figure 3A:
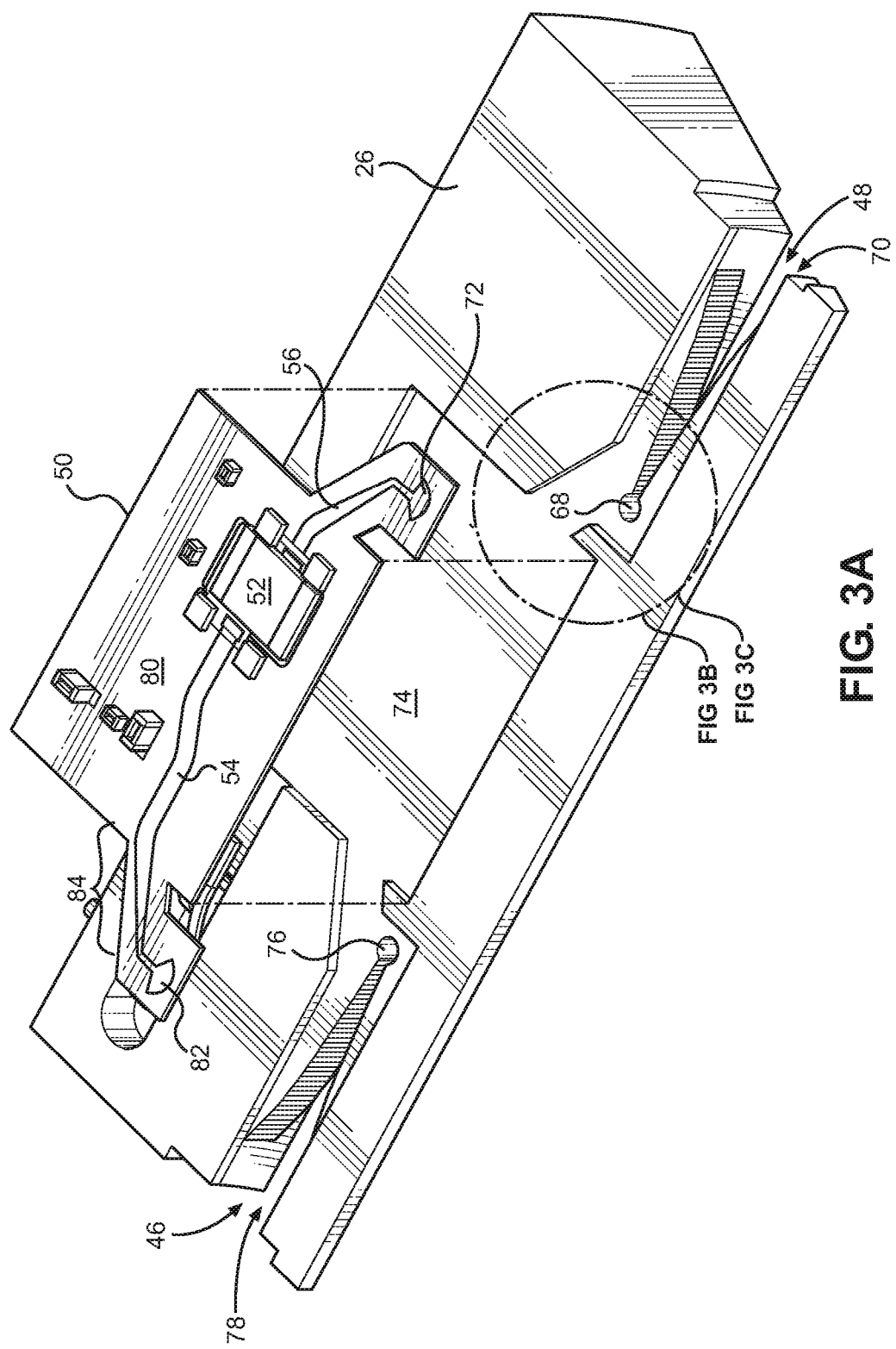
FIG. 3A illustrates the a printed circuit board assembly prior to attachment to the body of the amplifier assembly according to one embodiment.

FIG. 3A illustrates the PCB assembly 50 prior to attachment to the body 26. The body 26 comprises a metal, such as, by way of non-limiting example, silver-plated copper. The body 26 forms the first antenna 46 and the second antenna 48, which, in this example, are both Vivaldi antennas. The body 26 also forms a recess 74 which is configured to receive the PCB assembly 50. In some embodiments the recess 74 has a depth at least as great as a maximum height of the PCB assembly 50.

The body 26 forms the first antenna 46 and the second antenna 48. In this embodiment the first antenna 46 is a first Vivaldi antenna and includes a first circular backstub 76 and a first tapered slot 78. The PCB assembly 50 includes a PCB 80. The second transmission line 56 and the radial stub 72 are formed on top of the PCB 80, and the PCB 80 serves as an insulator between the radial stub 72 and the second antenna 48. Similarly, the first transmission line 54 and a first radial stub 82 are formed on top of the PCB 80, and operate to communicate the incoming signal from the first antenna 46 to the amplifier 52. The first transmission line 54 may also have an impedance transformer 84 that comprises a tapered portion of the first transmission line 54. Like the impedance transformer 66, the impedance transformer 84 is configured to minimize an impedance mismatch between an impedance of the first antenna 46 and the impedance $Z_{AMP}$ of the amplifier 52.

Figure 3B:
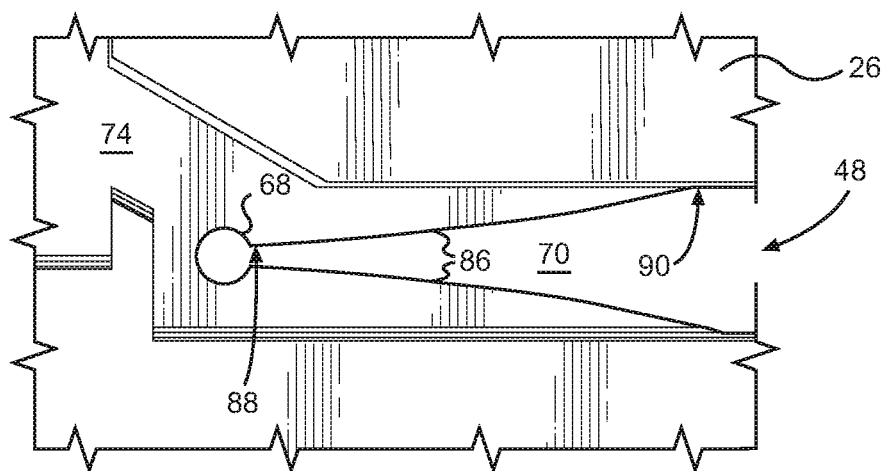
FIG. 3B is a top view of a second antenna formed in the body of the amplifier assembly according to one embodiment.
Figure 3C:
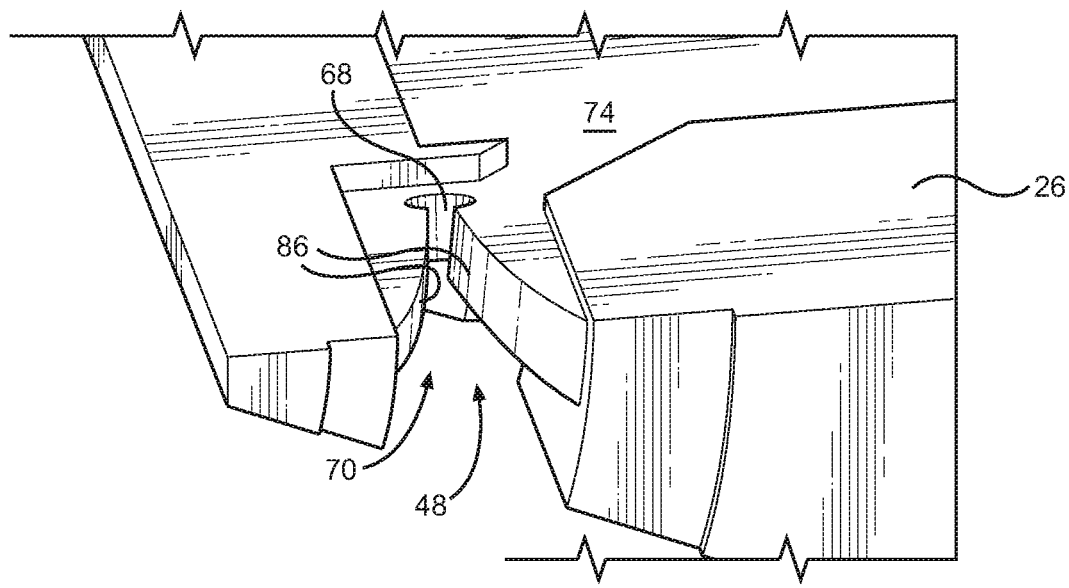
FIG. 3C is a side view of the second antenna formed in the body of the amplifier assembly according to one embodiment.

FIG. 3B is a top view of the second antenna 48 formed in the body 26. The tapered slot portion 70 may, in some embodiments, be formed by sidewalls 86 that have an exponential taper from a first slot end 88 to a second slot end 90. FIG. 3C is a side view of the second antenna 48 formed in the body 26.

Figure 4:
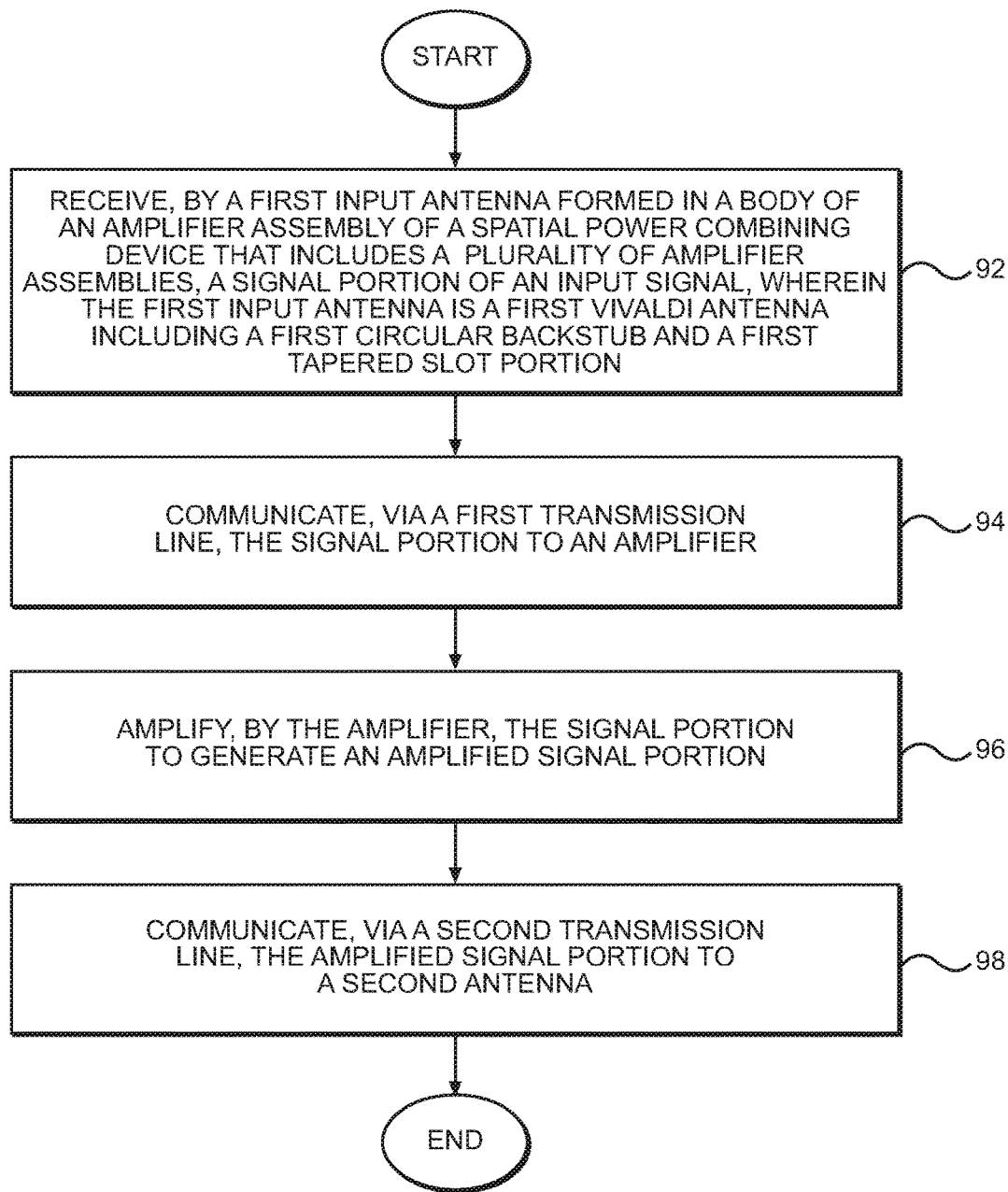
FIG. 4 is a flowchart of a method for amplifying a signal according to one embodiment.

FIG. 4 is a flowchart of a method for amplifying a signal according to one embodiment. The first antenna 46, formed in the body 26 of the amplifier assembly 22 of the SPCD 10 that includes a plurality of amplifier assemblies 22, receives a signal portion of the input signal 58. The first antenna 46 is a first Vivaldi antenna and includes the first circular backstub 76 and the first tapered slot portion 78 (FIG. 4, block 92). The first transmission line 54 communicates the signal portion to the amplifier 52 (FIG. 4, block 94). The amplifier 52 amplifies the signal portion to generate an amplified signal portion (FIG. 4, block 96). The second transmission line 56 communicates the amplified signal portion to the second antenna 48 (FIG. 4, block 98).

Figure 5:
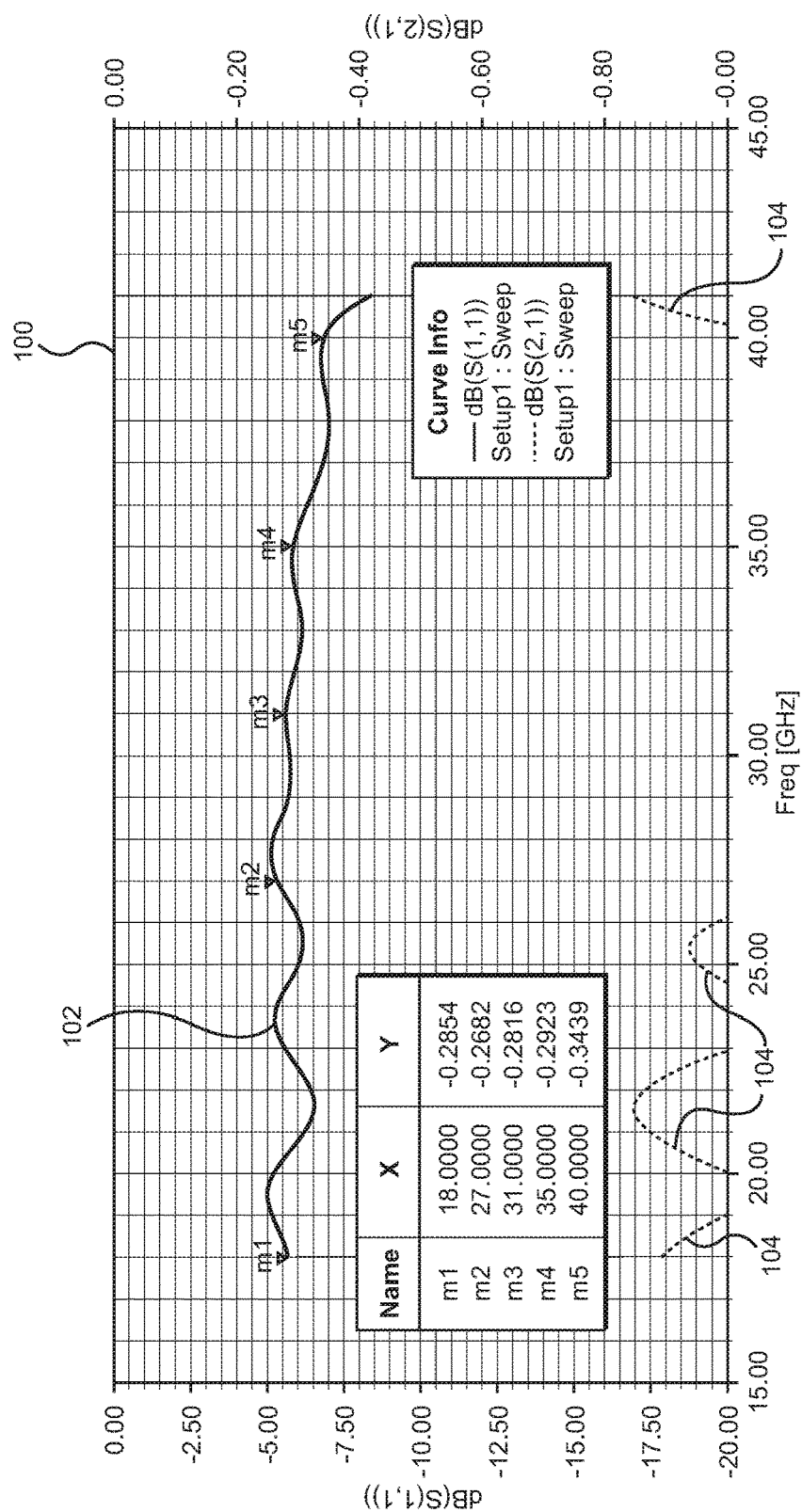
FIG. 5 is a graph that illustrates advantages of the SPCD of the disclosure over conventional SPCDs.

FIG. 5 is a graph 100 that illustrates advantages of the SPCD 10 over conventional SPCDs. The graph 100 illustrates a frequency response curve 102 of the SPCD 10 with substantially less loss compared to a frequency response curve 104 of a conventional SPCD at frequencies above 15 GHz.

Those skilled in the art will recognize improvements and modifications to the preferred embodiments of the present disclosure. All such improvements and modifications are considered within the scope of the concepts disclosed herein and the claims that follow.

What is claimed is:

1. An amplifier assembly for a spatial power combining device that comprises a plurality of amplifier assemblies, the amplifier assembly comprising:
   a body that forms a first antenna, wherein the first antenna is a first Vivaldi antenna comprising a first circular backstub and a first tapered slot portion;
   a second antenna; and
   a printed circuit board (PCB) assembly fixed to the body, comprising:
      a PCB;
      an amplifier mounted on the PCB;
      a first transmission line coupled to the first antenna and to the amplifier; and
      a second transmission line coupled to the second antenna and to the amplifier.

2. The amplifier assembly of claim 1 wherein the body forms the second antenna, and wherein the second antenna is a second Vivaldi antenna, the second Vivaldi antenna including a second circular backstub and a second tapered slot portion.

3. The amplifier assembly of claim 1 further comprising an impedance transformer coupled between the first antenna and the amplifier, the impedance transformer configured to impedance match between an impedance at the first antenna and an impedance at the amplifier.

4. The amplifier assembly of claim 3 wherein the impedance transformer comprises a tapered portion of the first transmission line.

5. The amplifier assembly of claim 1 wherein the first transmission line includes a radial stub.

6. The amplifier assembly of claim 1 wherein the body comprises silver-plated copper.

7. The amplifier assembly of claim 1 wherein the body forms a recess configured to receive the PCB assembly.

8. The amplifier assembly of claim 7 wherein the recess has a depth at least as great as a maximum height of the PCB assembly.

9. The amplifier assembly of claim 1 wherein a cross-section of the body is wedge-shaped.

10. The amplifier assembly of claim 1 wherein the amplifier is configured to:
receive a signal from the first Vivaldi antenna; and
amplify the signal to generate an amplified signal for transmission via the second antenna.

11. The amplifier assembly of claim 1 wherein the amplifier is a monolithic microwave integrated circuit (MMIC) amplifier.

12. A spatial power combining device (SPCD) comprising:
a center waveguide section comprising a plurality of amplifier assemblies, wherein each amplifier assembly comprises:
a body that forms a first antenna, wherein the first antenna is a first Vivaldi antenna comprising a first circular backstub and a first tapered slot portion;
a second antenna; and
a printed circuit board (PCB) assembly fixed to the body comprising:
a PCB;
an amplifier mounted on the PCB;
a first transmission line coupled to the first antenna and to the amplifier; and
a second transmission line coupled to the second antenna and to the amplifier;
an input port configured to receive a signal;
an input coaxial waveguide section coupled to the input port and configured to distribute the signal to the plurality of amplifier assemblies;
an output coaxial waveguide section configured to receive a plurality of output signals from the plurality of amplifier assemblies; and
an output port coupled to the output coaxial waveguide section.

13. The SPCD of claim 12 further comprising an impedance transformer coupled between the first antenna and the amplifier, the impedance transformer configured to impedance match between an impedance at the first antenna and an impedance at the amplifier.

14. The SPCD of claim 13 wherein the impedance transformer comprises a tapered portion of the first transmission line.

15. The SPCD of claim 12 wherein the body forms the second antenna, and wherein the second antenna is a second Vivaldi antenna, the second Vivaldi antenna including a second circular backstub and a second tapered slot portion.

16. A method comprising:
receiving, by a first input antenna formed in a body of an amplifier assembly of a spatial power combining device (SPCD) that comprises a plurality of amplifier assemblies, a signal portion of an input signal, wherein the first input antenna is a first Vivaldi antenna comprising a first circular backstub and a first tapered slot portion;
communicating, via a first transmission line, the signal portion to an amplifier, wherein the first transmission line and the amplifier are formed on a printed circuit board (PCB) assembly that is fixed to the body;
amplifying, by the amplifier, the signal portion to generate an amplified signal portion; and
communicating, via a second transmission line, the amplified signal portion to a second output antenna, wherein the second transmission line is formed on the PCB assembly.

17. The method of claim 16 further comprising:
concurrently receiving, by a plurality of input antennas including the first input antenna formed in corresponding bodies of the plurality of amplifier assemblies of the SPCD, corresponding signal portions of the input signal;
amplifying, by a plurality of amplifiers, the corresponding signal portions to generate a plurality of amplified signal portions; and
communicating, via the plurality of amplifiers, the plurality of amplified signal portions to a plurality of output antennas including the second output antenna.

18. The method of claim 17 wherein each input antenna comprises a Vivaldi antenna comprising a circular backstub and a tapered slot portion.

19. The method of claim 18 wherein each output antenna comprises a Vivaldi antenna comprising a circular backstub and a tapered slot portion.

\* \* \* \* \*